United States Patent
Beekmann et al.

(10) Patent No.: US 7,202,167 B2
(45) Date of Patent: Apr. 10, 2007

(54) METHOD OF FORMING A DIFFUSION BARRIER

(75) Inventors: Knut Beekmann, North Somerset (GB); Kathrine Giles, Bristol (GB)

(73) Assignee: Aviza Technology Limited, Newport, Gwent (GB)

( * ) Notice: Subject to any disclaimer, the term of this patent is extended or adjusted under 35 U.S.C. 154(b) by 0 days.

(21) Appl. No.: 10/946,310

(22) Filed: Sep. 22, 2004

(65) Prior Publication Data

US 2005/0042887 A1    Feb. 24, 2005

Related U.S. Application Data

(62) Division of application No. 10/310,757, filed on Dec. 6, 2002, now abandoned.

(60) Provisional application No. 60/392,058, filed on Jun. 28, 2002.

(30) Foreign Application Priority Data

Dec. 11, 2001    (GB) ................................ 0129567.4

(51) Int. Cl.
*H01L 21/44* (2006.01)

(52) U.S. Cl. ...................... 438/685; 438/584
(58) Field of Classification Search ................ 438/584, 438/684, 685, 686, 687
See application file for complete search history.

(56) References Cited

U.S. PATENT DOCUMENTS

| | | | |
|---|---|---|---|
| 4,357,179 A * | 11/1982 | Adams et al. ................ 148/1.5 |
| 4,647,472 A | 3/1987 | Hiraki et al. | |
| 4,968,384 A * | 11/1990 | Asano .......................... 438/96 |
| 5,956,616 A * | 9/1999 | Mizuno et al. ............. 438/680 |
| 6,159,559 A | 12/2000 | Berber et al. | |
| 6,201,291 B1 | 3/2001 | Kordic et al. | |
| 6,271,136 B1 * | 8/2001 | Shue et al. .................. 438/687 |
| 6,383,913 B1 | 5/2002 | Tsai et al. | |
| 6,436,824 B1 | 8/2002 | Chooi et al. | |
| 6,528,423 B1 | 3/2003 | Catabay et al. | |
| 6,562,725 B2 * | 5/2003 | Tsai et al. .................... 438/740 |
| 6,577,009 B1 | 6/2003 | You et al. | |
| 6,627,532 B1 | 9/2003 | Gaillard et al. | |
| 6,713,390 B2 | 3/2004 | M'Saad et al. | |
| 6,743,473 B1 * | 6/2004 | Parkhe et al. ................ 427/252 |
| 2001/0030369 A1 * | 10/2001 | MacNeil et al. ............. 257/760 |

FOREIGN PATENT DOCUMENTS

| | | |
|---|---|---|
| EP | 0 322 161 A2 | 6/1989 |
| EP | 0 724 440 A2 | 8/1996 |
| JP | 63136567 A | 6/1988 |
| JP | 4-65310 | 3/1992 |
| WO | WO 00/19498 | 4/2000 |

* cited by examiner

*Primary Examiner*—Phuc T. Dang
(74) *Attorney, Agent, or Firm*—Volentine & Whitt, PLLC

(57) ABSTRACT

A barrier limits the diffusion of a metal, such as copper, into an insulating layer. The barrier may take the form of insulating layer made of a silicon carbide type material which has been exposed to ionised hydrogen subsequent to deposition. Preferably the material contains nitrogen and it is particularly preferred that the material has a dielectric constant of 3.5 or less.

20 Claims, 4 Drawing Sheets

METHOD OF FORMING A DIFFUSION BARRIER

CROSS-REFERENCE TO RELATED APPLICATION(S)

This is a divisional of and a claim of priority is made to U.S. non-provisional application Ser. No. 10/310,757, filed Dec. 6, 2002 now abandoned, which in turn claims priority to U.S. provisional application No. 60/392,058, filed Jun. 28, 2002, and to British patent application No. 0129567.4, filed Dec. 11, 2001.

BACKGROUND OF THE INVENTION

1. Field of the Invention

This invention relates to a metal diffusion barrier of insulating material and in particular, but not exclusively, to barriers which limit the diffusion of copper into an insulating layer.

2. Background of the Invention

It is well known, in the manufacture of semiconductors and similar devices, that if a metal, such as copper, has a direct interface with an insulating material such as silicon dioxide, then, particularly when the metal atoms are energetic under heating or when current is passed, those metal atoms diffuse into the insulating layer and can set up a conducting short circuit between wiring lines and the like. The likelihood of such occurrences increases as the dimensions of the architecture of the devices decreases.

It has been known for some time that the way to overcome this problem is to deposit a barrier layer between the metal and the insulating layer. However, many of the usual candidates, such as silicon nitride, significantly increase the capacitance created by the insulating layer as a whole which is undesirable.

WO00/19498 proposes the use of a SiC material as a barrier layer, but the materials suggested all have a dielectric constant of over 4 and indeed 4.2 seems to be the best value reported for the barrier layer.

EP-0725440 also suggests the possibility of silicon carbides being used as diffusion barriers or having the silicon carbides as the insulating layer themselves. The specification is however very short on description and is confused about the dielectric constants involved. However, in its plainest statement, it would appear that the dielectric constant of the silicon carbide is nearer 5 than 3.5.

SUMMARY OF THE INVENTION

From one aspect the present invention consists in a copper diffusion barrier including an insulating layer of silicon carbide type material, the layer having a thickness of 100 nanometers or less, a dielectric constant of 3.5 or less and containing nitrogen and hydrogen.

From a further aspect the invention consists in a metal diffusion barrier comprising a layer of silicon carbide type material which has been exposed to ionised hydrogen, e.g. a hydrogen containing plasma, subsequent to deposition. Preferably the material contains nitrogen and it is particularly preferred that the material has a dielectric constant of 3.5 or less.

Where the layer is exposed to the plasma, it is preferred that the period of exposure is determined by the thickness of the layer. The period may be calculated at about 40 seconds per hundred nanometers of layer thickness. The treatment requires a sufficiency of ionised hydrogen at the surface of the layer and has been successfully carried out at 1 KW of RF applied to both a 230 mm and 360 mm diameter electrode opposed a 200 mm wafer—being plasma densities of 2.4 Watt/cm$^2$ and 1 Watt/cm$^2$ approximately.

The layer is preferably deposited by chemical vapour deposition (CVD) and most preferably by plasma enhanced CVD (PECVD) and the precursors for the CVD preferably are or include tetramethylsilane and nitrogen. However, other organo-silanes or mixtures thereof may be utilised and the nitrogen may be present in a nitrogen containing gas. The CVD may take place at a temperature less than about 60° C.

The invention may further include a dielectric assembly comprising a dielectric layer and an insulating barrier layer, as defined above, deposited on or under the dielectric layer. The dielectric constant of both layers may be 3.5 or less.

The etch selectivity of the barrier layer may be at least 3:1, and preferably at least 4.5:1, to the dielectric layer, which may be silicon dioxide and, in particular maybe a porous silicon dioxide. A convenient material is Trikon Technologies Limited's Orion material which has a dielectric constant of approximately 2.2.

Alternatively, in many arrangements, the low dielectric constant of the insulating silicon carbide type material allows it to be used as a dielectric layer itself and may enable a deposited barrier layer to be dispensed with at least in certain circumstances. Thus if a recess or other formation is etched into the silicon carbide, the resultant exposed surface can be hydrogen plasma treated, as proposed above, to form an effective barrier layer at the surface of the formation. Similarly, where a metal layer or wire lies beneath the dielectric layer, hydrogen treatment may be introduced for the initial part of the deposition either by passing hydrogen into the chamber or by providing a short interruption in the supply of precursors to allow hydrogen treatment to take place.

The invention also consists in a method of forming a metal diffusion barrier including depositing the barrier by CVD from an organic silane containing precursor and nitrogen and hydrogen plasma treating the layer subsequent to or during deposition.

Preferably the silane precursor is tetramethylsilane, but any suitable organo-silane or mixture thereof can be used.

For the formation of barrier layers, it is particularly preferred that the nitrogen flow rate is significantly higher than the silane flow rate and a nitrogen flow rate of at least ten times that of the silane flow rate is preferred. The CVD may take place at less than 60° C.

The barrier layer may be exposed to the ionised hydrogen, e.g. from a plasma, for a period determined by the thickness of the layer and that period may be calculated at about 40 seconds per 100 nanometer of layer thickness.

Although the invention has been defined above, it is to be understood that it includes any inventive combination of the features set out above and in the following description.

BRIEF DESCRIPTION OF THE DRAWINGS

The invention may be performed in various ways and specific embodiments will now be described with reference to the accompany drawings, in which.

DETAILED DESCRIPTION OF THE PREFERRED EMBODIMENTS

A nitrogen-containing hydrogenated silicon carbide like material was deposited using the process of Table 1. In this table 4MS stands for tetramethylsilane. The process is characterized as "low temperature", by which is meant that it takes place at less than about 60° C.

TABLE 1

| 4MS | $N_2$ | Pressure | Power | Temperature | Electrode gap |
|---|---|---|---|---|---|
| 50 sccm | 800 sccm | 750 mT | 500 W | 15° C. | 10 mm |

It will be noted that the flow rate for the nitrogen is significantly higher than the 4MS flow rate and this approach is somewhat different to previous proposals relating to nitrogen-containing silicon carbide materials, which have previously been developed to achieve an insulator of low dielectric constant. In the experiment the as-deposited material was further processed or "set" by the plasma process of Table 2. Hydrogen plasma processing of dielectric layers has previously been proposed in order to reduce the dielectric constant of those materials and it has been discovered that this reduction in k value is because the material is rendered at least partially porous. It is therefore somewhat surprising that hydrogen plasma treatment should be beneficial in improving the materials resistance to diffusion.

Experimentation has shown that if the plasma treatment is carried out for the kind of periods utilised in creating low dielectric constant dielectric layers, then a significant crust of carbon depleted material is formed on the deposited layer of the material of the present invention, which is undesirable from the point of view of its barrier properties and dielectric constant. Therefore for the material of the experiment at least, shorter periods of around 40 seconds per hundred nanometers thickness of material have proved to be appropriate and it is believed that periods of as low as 20 seconds per hundred nanometers thickness of material will improve the barrier qualities of the material.

TABLE 2

| $H_2$ | Pressure | Power | Temperature | Time |
|---|---|---|---|---|
| 500 sccm | 4 Torr | 1000 Watts | 400° C. | 40 seconds per 100 nm |

In both tables, the substrate is 200 mm dia and the temperature is that of the wafer platen. Pressure is in torr/millitorr, gas flow is standard cubic centimeters per minute and the power is 13.56 MhzRF applied to a 230 mm dia electrode opposing the wafer platen. The traces in FIG. 2 and FIG. 3 illustrate the difference between the current film (FIG. 2) after hydrogen plasma treatment and the prior art silicon carbide of FIG. 3.

Figure 2:
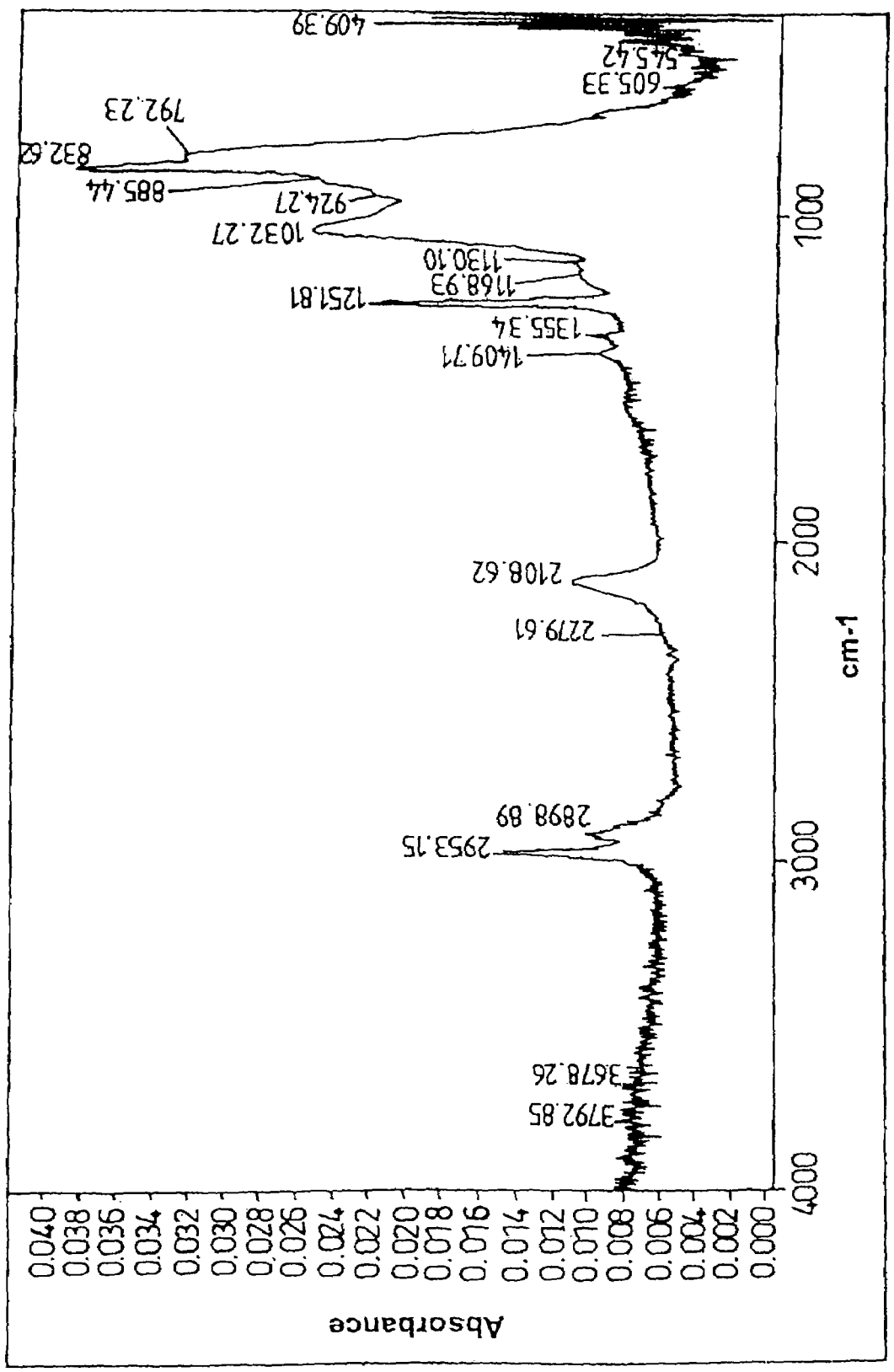
FIG. 2 is an FTIR trace of the material of FIG. 1 after hydrogen plasma treatment.
Figure 3:
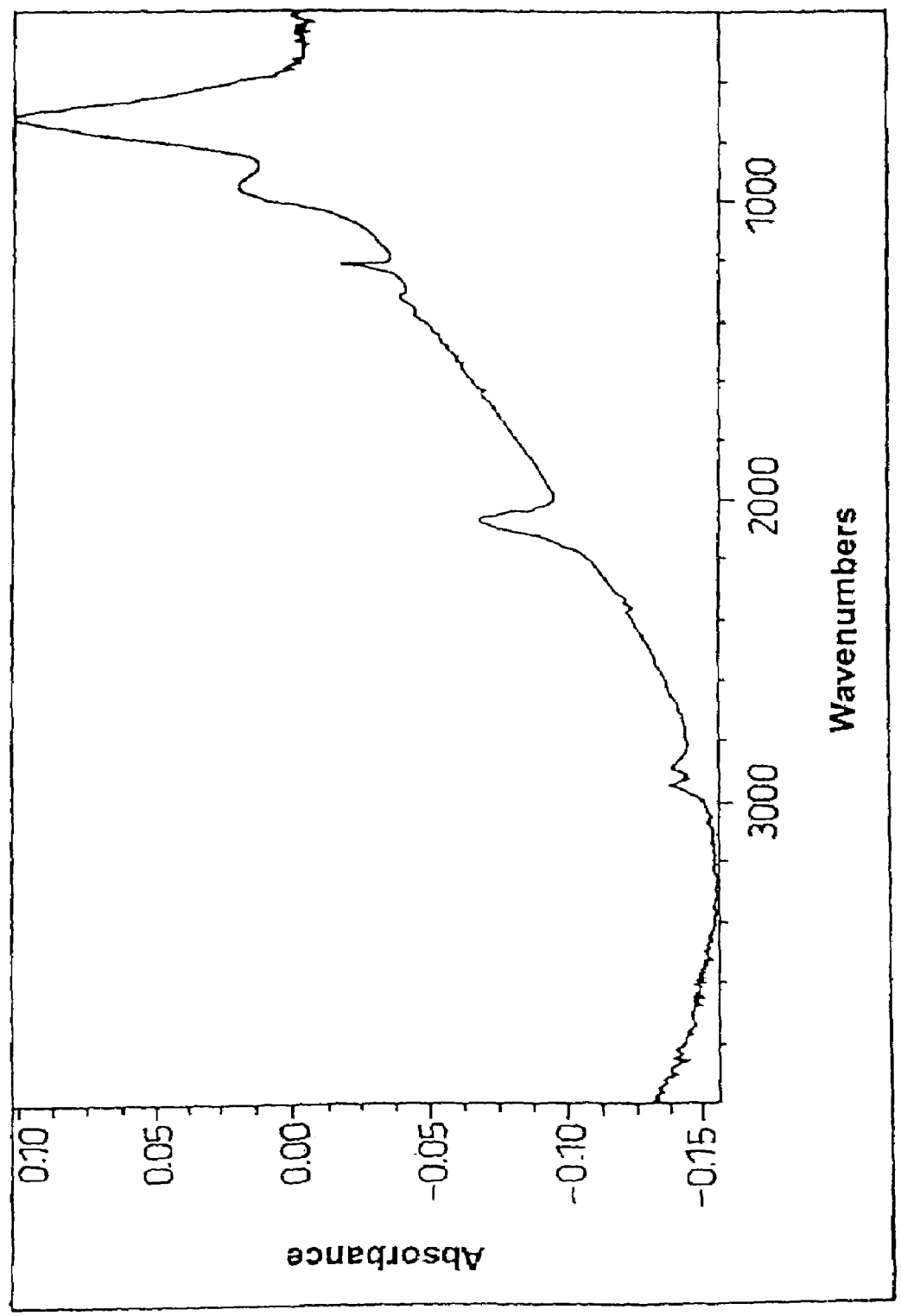
FIG. 3 is an FTIR trace of a prior art silicon carbide deposited using trimethylsilane at a higher deposition temperature.

From FIG. 2 the composition of the material seems primarily to be Si—N($\sim$832 cm$^{-1}$), Si—C($\sim$800 cm$^{-1}$), Si—CH$_2$—Si($\sim$1040 cm$^{-1}$), Si—CH$_3$ ($\sim$1260 cm$^{-1}$), Si—H ($\sim$2100 cm$^{-1}$), C—H($\sim$2900 cm$^{-1}$). The presence of Si—N is also firmly evidenced by XPS (X-ray Photo-electron Spectroscopy) depth profile data, which reveals the presence of nitrogen at up to about 9% of the peaks detected in this particular film. Hydrogen, not detected by XPS, is expected to constitute 40 atomic % or more of the material.

Figure 4:
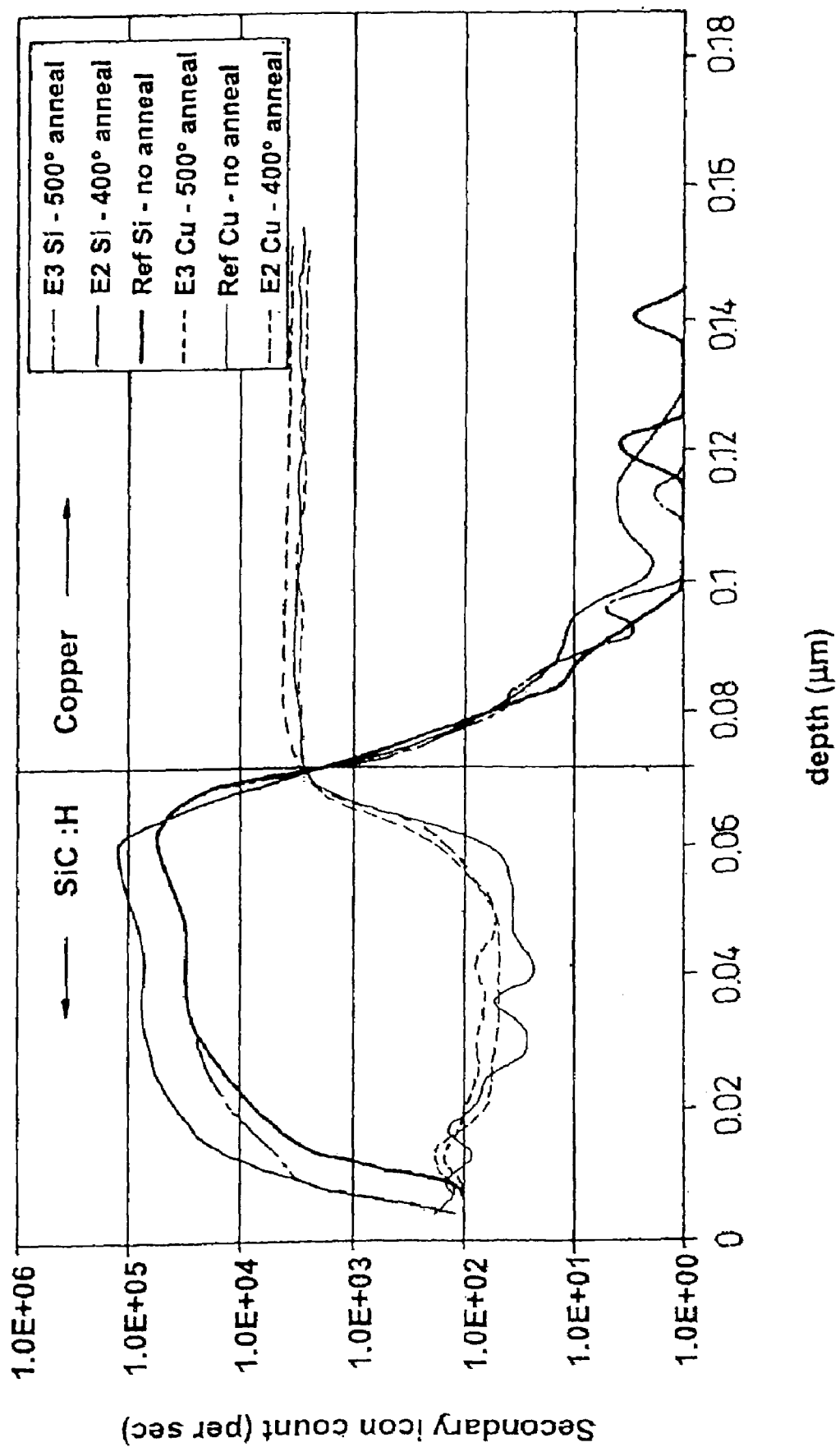
FIG. 4 is a SIMS (Secondary Ion Mass Spectroscopy) diagram which illustrates the secondary ion count on either side of a silicon carbide copper interface for various anneal temperatures.

In FIG. 4 a layer of the film was deposited on a layer of copper and the secondary ion count was monitored both sides of the interface, which is indicated by a vertical line on the diagram. The diffusion of silicon ions into the copper and copper ions into the silicon is duly plotted as shown by the legend for no anneal, 400° C. anneal and 500° C. anneal. It will be noted that there is effectively no difference in the level of copper diffusion across the boundary as temperatures are increased up to 500° C. and this accordingly shows that the applicants have developed a low dielectric materials which constitutes a good diffusion barrier to copper. Experiments to date have been limited to copper diffusion. These characteristics are also indicative of, more generally, alkali metal ion and moisture barrier properties.

Figure 1:
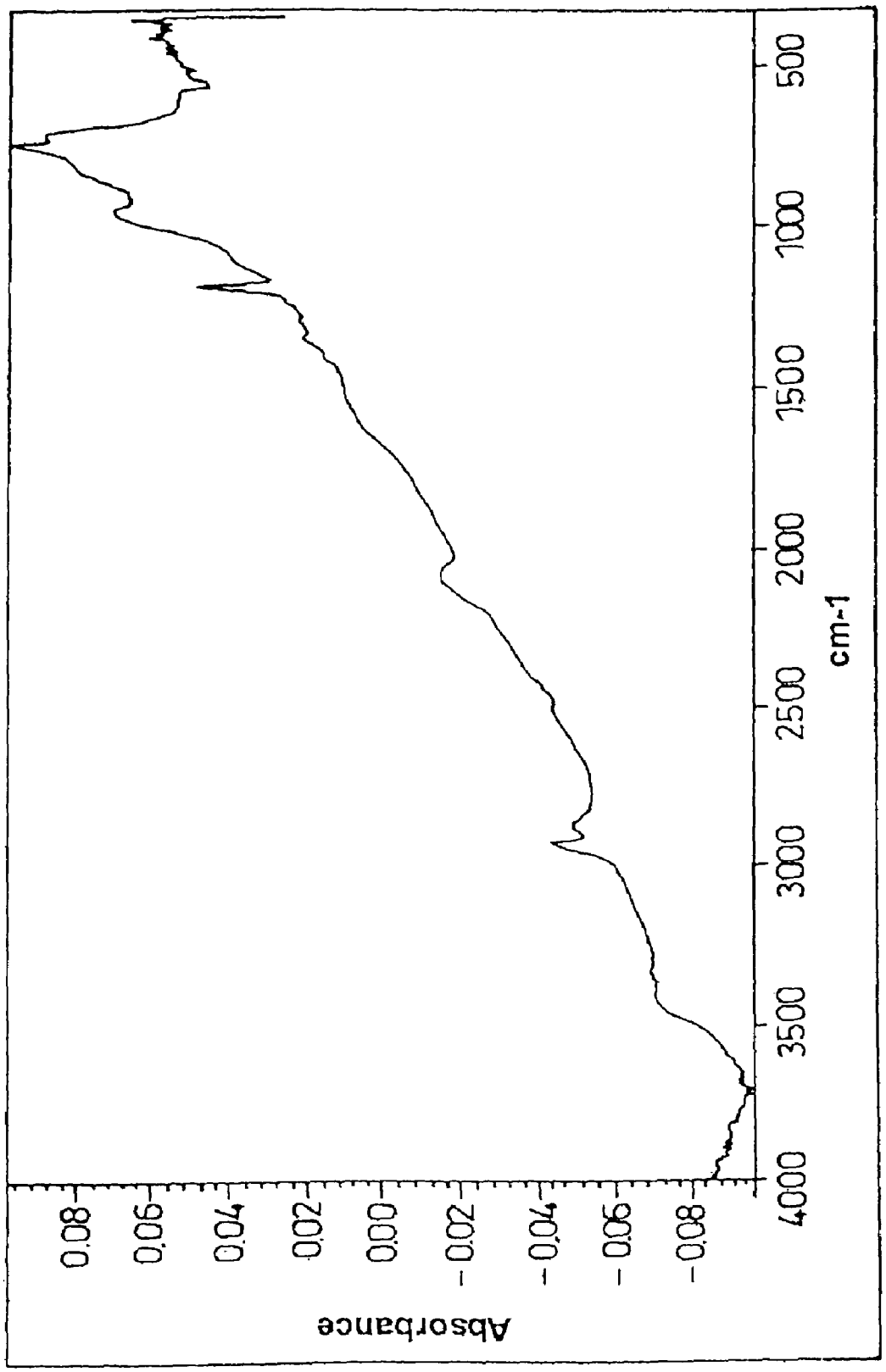
FIG. 1 is an FTIR (Fourier Transform Infra Red) trace of a nitrogen containing silicon carbide etch stop layer.

The hydrogen treatment has been carried out with an R.F. powered electrode at 1 KW in both a 300 m (360 mm diameter) and 200 mm (230 mm diameter) process module upon a cluster tool suitable for semiconductor wafer processing. FIGS. 1 and 2 evidence the change in the film caused by the ionised hydrogen process which is at least partly chemical and at these power levels is not rate-limited by power applied. It is presumed that activated hydrogen reacts with the layer in a manner that is not wholly as a result of ion impact with its surface.

What is claimed is:

1. A method of forming barrier layer of insulating material which inhibits the diffusion of a metal into an underlying layer, comprising depositing a layer by CVD from an organic silane containing precursor and nitrogen, and hydrogen plasma treating the layer subsequent to or during the CVD deposition to form the barrier layer of insulating material.

2. The method as claimed in claim 1, wherein the silane precursor is tetramethylsilane.

3. The method as claimed in claim 1, wherein a flow rate of the nitrogen is at least ten times a flow rate of the silane precursor.

4. The method as claimed in claim 2, wherein a flow rate of the nitrogen is at least ten times a flow rate of the tetramethylsilane.

5. The method as claimed in claim 1, wherein the CVD deposition takes place at less than 60° C.

6. The method as claimed in claim 1, wherein the layer is treated with the hydrogen plasma for a period of time determined by a thickness of the layer.

7. The method as claimed in claim 1, wherein the layer is treated with the hydrogen plasma for about 40 seconds per hundred nanometers of thickness of the layer.

8. The method as claimed in claim 1, wherein the nitrogen is nitrogen gas.

9. The method as claimed in claim 8, wherein the hydrogen plasma is formed from hydrogen gas.

10. The method as claims in claim 1, wherein a dielectric constant of the insulating material is 3.5 or less.

11. A method of forming a dielectric assembly, comprising:

forming a barrier layer of insulating material on an underlying layer, wherein the barrier layer is formed by depositing a layer by CVD from an organic silane containing precursor and nitrogen, and hydrogen plasma treating the layer subsequent to or during the CVD deposition; and forming a metal layer on the barrier layer, wherein the barrier layer inhibits the diffusion of the metal layer into the underlying layer.

12. The method as claimed in claim 11, wherein the CVD deposition takes place at less than 60° C.

13. The method as claimed in claim 11, wherein the silane precursor is tetramethylsilane.

14. The method as claimed in claim 11, wherein a flow rate of the nitrogen is at least ten times a flow rate of the silane precursor.

15. The method as claimed in claim 11, wherein a flow rate of the nitrogen is at least ten times a flow rate of the tetramethylsilane.

16. The method as claimed in claim 11, wherein the layer is treated with the hydrogen plasma for a period of time determined by a thickness of the layer.

17. The method as claimed in claim 11, wherein the layer is treated with the hydrogen plasma for about 40 seconds per hundred nanometers of thickness of the layer.

18. The method as claimed in claim 11, wherein the nitrogen is nitrogen gas.

19. The method as claimed in claim 18, wherein the hydrogen plasma is formed from hydrogen gas.

20. The method as claims in claim 11, wherein a dielectric constant of the insulating material is 3.5 or less.

* * * * *